US011012078B1

(12) United States Patent
Hirai et al.

(10) Patent No.: US 11,012,078 B1
(45) Date of Patent: May 18, 2021

(54) IQ SIGNAL SOURCE

(71) Applicant: Mitsubishi Electric Corporation, Tokyo (JP)

(72) Inventors: Akihito Hirai, Tokyo (JP); Mitsuhiro Shimozawa, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 113 days.

(21) Appl. No.: 16/478,647

(22) PCT Filed: Mar. 10, 2017

(86) PCT No.: PCT/JP2017/009727
§ 371 (c)(1),
(2) Date: Jul. 17, 2019

(87) PCT Pub. No.: WO2018/163405
PCT Pub. Date: Sep. 13, 2018

(51) Int. Cl.
*H03L 7/099* (2006.01)
*H03L 7/07* (2006.01)
*H03B 5/12* (2006.01)
*H03L 7/085* (2006.01)

(52) U.S. Cl.
CPC ........... *H03L 7/099* (2013.01); *H03B 5/1228* (2013.01); *H03L 7/07* (2013.01); *H03L 7/085* (2013.01); *H03B 2200/0078* (2013.01)

(58) Field of Classification Search
CPC ...................................................... H03L 7/099
See application file for complete search history.

(56) References Cited

U.S. PATENT DOCUMENTS

| 6,937,107 | B2* | 8/2005 | Ravi | ...................... H03B 27/00 |
| | | | | 331/47 |
| 8,362,809 | B2* | 1/2013 | Li | ........................ H03B 5/1243 |
| | | | | 327/105 |
| 8,929,502 | B2* | 1/2015 | Endo | .................. H04L 27/0014 |
| | | | | 375/376 |

OTHER PUBLICATIONS

Andreani et al. "Analysis and Design of a 1.8-GHz CMOS LC Quadrature VCO", IEEE Journal of Solid-State Circuits, vol. 37, No. 12, Dec. 2002, p. 1737-1747.

* cited by examiner

*Primary Examiner* — Hai L Nguyen
(74) *Attorney, Agent, or Firm* — Birch, Stewart, Kolasch & Birch, LLP (57) ABSTRACT

An IQ signal source (100) includes: a Q-VCO (3) having a first VCO (1) and a second VCO (2), the IQ signal source (100) outputting an I signal and a Q signal by electrically coupling the first VCO (1) and the second VCO (2) with each other; a first PLL (10) for comparing a frequency of the I signal or the Q signal with a frequency of a reference signal input from the outside of the IQ signal source (100) and outputting a voltage depending on a result of the comparison; and a second PLL (9) for detecting an IQ phase difference and outputting a voltage depending on the IQ phase difference. The IQ phase difference converges to 90 degrees in dependence on the output voltage of the first PLL (10) and the output voltage of the second PLL (9).

12 Claims, 7 Drawing Sheets

IQ SIGNAL SOURCE

TECHNICAL FIELD

The present invention relates to an IQ signal source that generates an in-phase signal (hereinafter referred to as "I signal") and a quadrature signal (hereinafter referred to as "Q signal").

BACKGROUND ART

Conventionally, in a radio communication device, a radar, or the like, an IQ signal source that generates I and Q signals having a phase difference of about 90 degrees from each other is used. For example, when a direct conversion receiver performs frequency conversion processing, the IQ signal source is required for quadrature signal processing. Also, when a superheterodyne receiver performs frequency conversion processing by image reduction, the IQ signal source is required for complex signal processing.

For the IQ signal source, there is a system in which a local signal is oscillated at twice the frequency and a rising edge and a falling edge of the local signal are used (so-called "frequency division system"), or a system using a filter corresponding to transfer characteristics of a resistor and a capacitor (so-called "polyphase filter system"). However, particularly at high frequencies in tens of gigahertz (GHz) band, the frequency division system has a problem that it is difficult to realize an oscillator, and the polyphase filter system has a problem that attenuation is large.

To avoid these problems, a quadrature VCO (hereinafter referred to as "Q-VCO") that generates I and Q signals by electrically coupling two voltage controlled oscillators (hereinafter referred to as "VCO") has been developed. For example, Non-Patent Literature 1 discloses a Q-VCO using a transistor for VCO coupling. A Q-VCO in which two VCOs have mutually the same electrical characteristics, that is, an ideal Q-VCO, can generate I and Q signals having a phase difference of 90° from each other.

CITATION LIST

Non-Patent Literatures

Non-Patent Literature 1: Pietro Andreani, Andrea Bonfanti, Luca Romano, and Carlo Samori, "Analysis and Design of a 1.8-GHz CMOS LC Quadrature VCO," IEEE JOURNAL OF SOLID-STATE CIRCUITS, VOL. 37, NO. 12, DECEMBER 2002.

SUMMARY OF INVENTION

Technical Problem

When a Q-VCO is constituted by an integrated circuit, relative element values in the integrated circuit have a variation (so-called "mismatch variation"), so that electrical characteristics of the VCOs have approximately the same variation as the above variation. As a result, a phase difference between an I signal and a Q signal (hereinafter referred to as "IQ phase difference") has accuracy on the same level of the above variation, and an error occurs in the IQ phase difference.

In general, the mismatch variation is a value of about several percent (%) at the maximum and a value equal to or less than 0.5% at the minimum. When the mismatch variation in the Q-VCO is 0.5%, the IQ phase difference has an error of 360 degrees×0.5%=1.8 degrees. The conventional IQ signal source using the Q-VCO cannot compensate for this error, and there is a problem that it is difficult to improve the accuracy of the IQ phase difference.

The present invention has been made to solve the problems as described above, and an object of the present invention is to improve accuracy of an IQ phase difference in an IQ signal source using a Q-VCO.

Solution to Problem

An IQ signal source according to the present invention includes: a quadrature voltage controlled oscillator having a first voltage controlled oscillator and a second voltage controlled oscillator, the IQ signal source outputting an in-phase signal and a quadrature signal by electrically coupling the first voltage controlled oscillator and the second voltage controlled oscillator with each other; a first phase locked loop to compare a frequency of the in-phase signal or the quadrature signal with a frequency of a reference signal input from the outside of the IQ signal source and to output a voltage depending on a result of the comparison; and a second phase locked loop to detect a phase difference between the in-phase signal and the quadrature signal and to output a voltage depending on the phase difference, wherein the phase difference converges to 90 degrees in dependence on the output voltage of the first phase locked loop and the output voltage of the second phase locked loop.

Advantageous Effects of Invention

As the present invention is constituted as described above, accuracy of an IQ phase difference in an IQ signal source using a Q-VCO can be improved.

DESCRIPTION OF EMBODIMENTS

Hereinafter, in order to explain the present invention in more detail, embodiments for carrying out the present invention will be described with reference to the accompanying drawings.

First Embodiment

Figure 1:
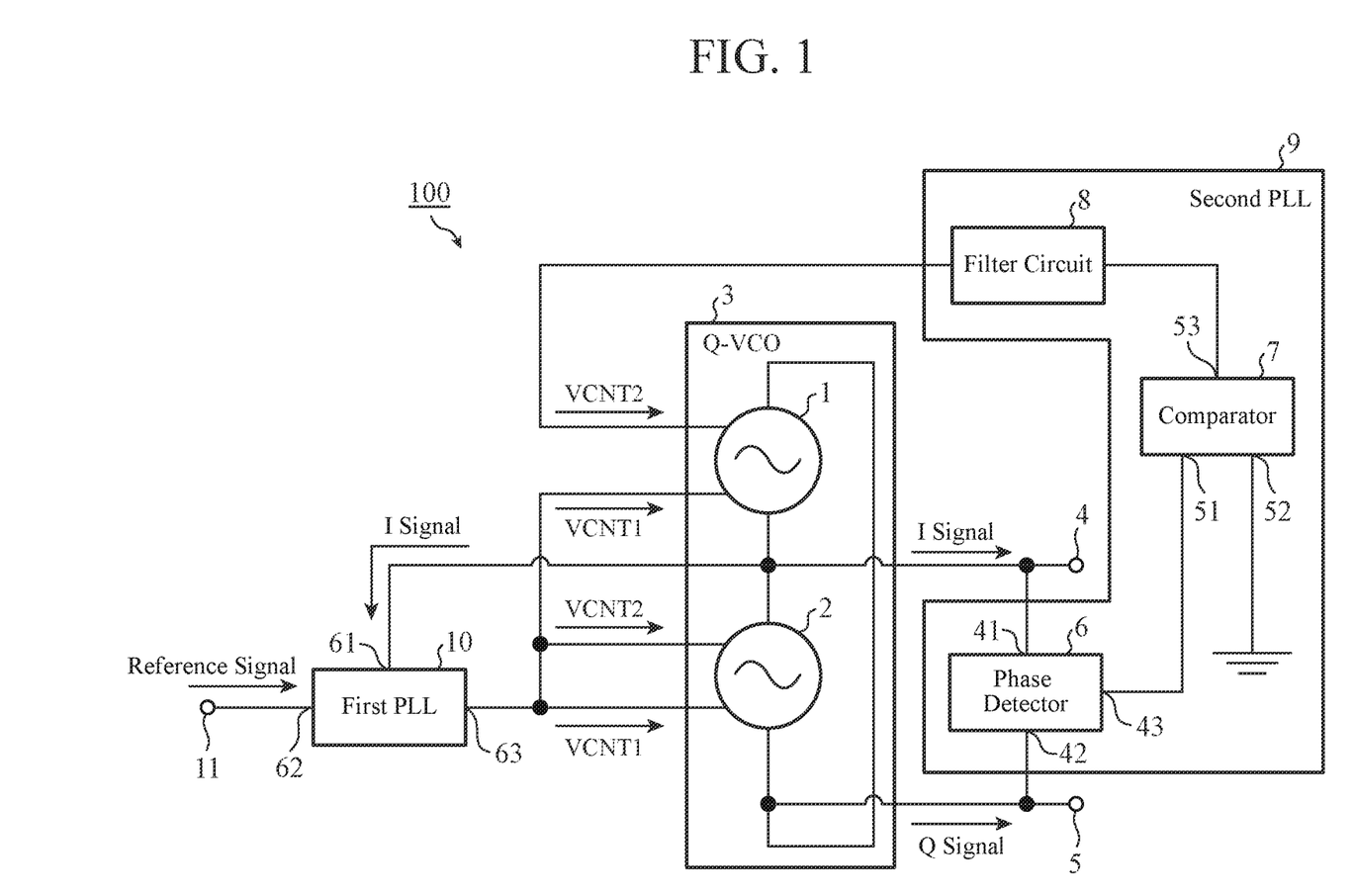
FIG. 1 is a circuit diagram showing a main part of an IQ signal source according to a first embodiment of the present invention.
Figure 2A:
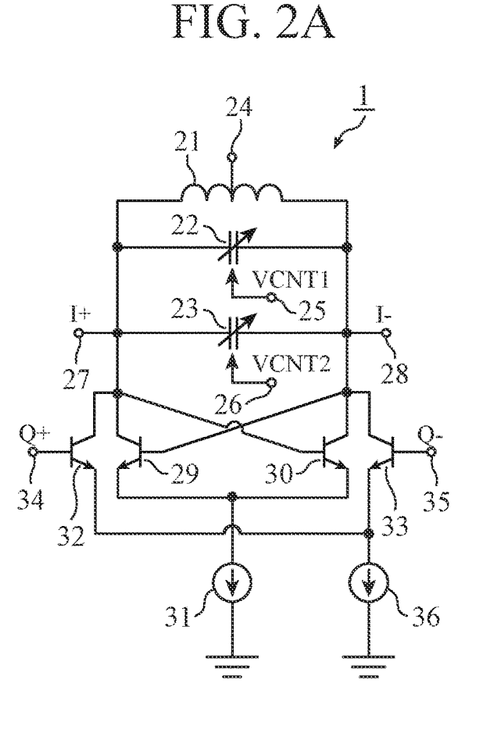
FIG. 2A is a circuit diagram showing a main part of a first VCO according to the first embodiment of the present invention.
Figure 2B:
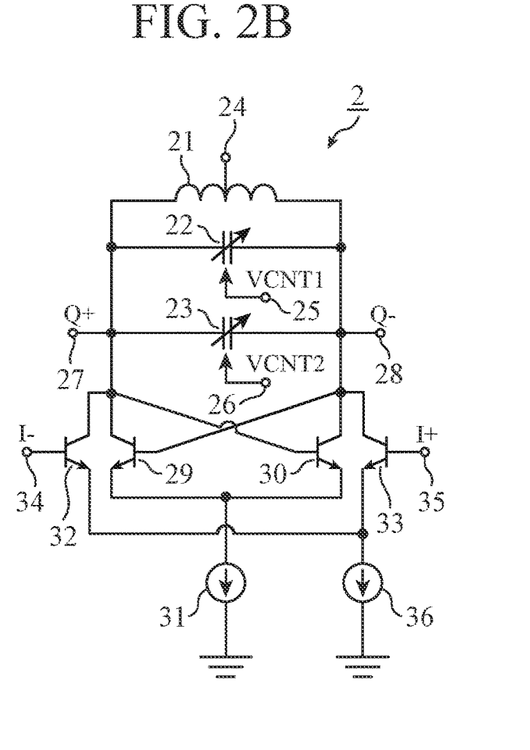
FIG. 2B is a circuit diagram showing a main part of a second VCO according to the first embodiment of the present invention.
Figure 3A:
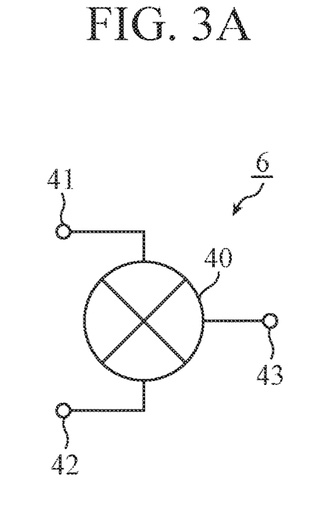
FIG. 3A is an explanatory diagram showing a multiplier corresponding to a phase detector according to the first embodiment of the present invention.
Figure 3B:
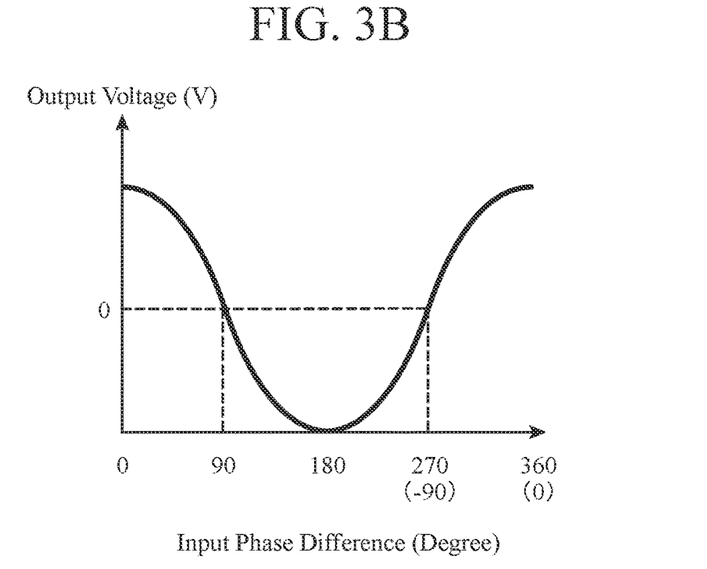
FIG. 3B is a characteristic diagram showing an output voltage with respect to an input phase difference in the multiplier shown in FIG. 3A.

FIG. 1 is a circuit diagram showing a main part of an IQ signal source according to a first embodiment of the present invention. FIG. 2A is a circuit diagram showing a main part of a first VCO according to the first embodiment of the present invention. FIG. 2B is a circuit diagram showing a main part of a second VCO according to the first embodiment of the present invention. FIG. 3A is an explanatory diagram showing a multiplier corresponding to a phase detector according to the first embodiment of the present invention. FIG. 3B is a characteristic diagram showing an output voltage with respect to an input phase difference in the multiplier shown in FIG. 3A. An IQ signal source 100 in the first embodiment will be described with reference to FIGS. 1 to 3.

As shown in FIG. 1, a quadrature voltage controlled oscillator (hereinafter referred to as "Q-VCO") 3 is constituted by a first voltage controlled oscillator (hereinafter referred to as "first VCO") 1 and a second voltage controlled oscillator (hereinafter referred to as "second VCO") 2. The Q-VCO 3 outputs an I signal and a Q signal by electrically coupling the first VCO 1 and the second VCO 2 with each other.

FIG. 2 shows an example of specific circuit configurations of the first VCO 1 and the second VCO 2. As shown in FIG. 2, each of the first VCO 1 and the second VCO 2 is constituted by a differential VCO using an inductor and a variable capacitor.

In other words, an inductor 21, a first variable capacitor 22, and a second variable capacitor 23 constitute an LC parallel resonant circuit. A power supply application terminal 24 for receiving application of a voltage from a power supply (not shown) is connected to the inductor 21. A capacitance of the first variable capacitor 22 changes in dependence on an input voltage (hereinafter referred to as "first control voltage") VCNT1 to a first voltage input terminal 25. A capacitance of the second variable capacitor 23 changes in dependence on an input voltage (hereinafter referred to as "second control voltage") VCNT2 to a second voltage input terminal 26. An output terminal 27 is provided at one end of the LC parallel resonant circuit, and an output terminal 28 is also provided at another end of the LC parallel resonant circuit.

Each of the first VCO 1 and the second VCO 2 has transistors 29 and 30 for oscillation. The transistors 29 and 30 are connected so as to provide positive feedback using the LC parallel resonant circuit as a load. A DC current source 31 is provided between an emitter of the transistors 29 and 30 and ground (hereinafter referred to as "GND").

Each of the first VCO 1 and the second VCO 2 has transistors 32 and 33 for coupling. The transistor 32 amplifies a signal input to an input terminal 34 and outputs it to one end of the LC parallel resonant circuit. The transistor 33 amplifies a signal input to an input terminal 35 and outputs it to another end of the LC parallel resonant circuit. A DC current source 36 is provided between an emitter of the transistors 32 and 33 and the GND.

The output terminal 27 of the first VCO 1 is electrically connected with the input terminal 35 of the second VCO 2 by a signal line (not shown). The output terminal 28 of the first VCO 1 is electrically connected with the input terminal 34 of the second VCO 2 by a signal line (not shown). The output terminal 27 of the second VCO 2 is electrically connected with the input terminal 34 of the first VCO 1 by a signal line (not shown). The output terminal 28 of the second VCO 2 is electrically connected with the input terminal 35 of the first VCO 1 by a signal line (not shown).

The output terminals 27 and 28 of the first VCO 1 output signals opposite in phase to each other. In the example shown in FIG. 2, a signal output from the output terminal 27 of the first VCO 1, that is, a signal input to the input terminal 35 of the second VCO 2, and a signal output from the output terminal 28 of the first VCO 1, that is, a signal input to the input terminal 34 of the second VCO 2 become the I signals. In other words, potentials I+ and I− of these terminals 27, 28, 34, and 35 correspond to voltages of the I signals shown in FIG. 1.

The output terminals 27 and 28 of the second VCO 2 output signals opposite in phase to each other. In the example shown in FIG. 2, a signal output from the output terminal 27 of the second VCO 2, that is, a signal input to the input terminal 34 of the first VCO 1, and a signal output from the output terminal 28 of the second VCO 2, that is, a signal input to the input terminal 35 of the first VCO 1 become the Q signals. In other words, potentials Q+ and Q− of these terminals 27, 28, 34, and 35 correspond to voltages of the Q signals shown in FIG. 1.

Here, an oscillation frequency of the Q-VCO 3 has a value depending on an oscillation frequency of each of the first VCO 1 and the second VCO 2, an oscillation frequency of each of the first VCO 1 and the second VCO 2 has a value depending on a constant of the LC parallel resonant circuit, and the constant of the LC parallel resonant circuit has a value depending on the capacitance of the first variable capacitor 22 and the capacitance of the second variable capacitor 23. As described above, the capacitance of the first variable capacitor 22 changes in dependence on the first control voltage VCNT1, and the capacitance of the second variable capacitor 23 changes in dependence on the second control voltage VCNT2.

In other words, the oscillation frequency of the first VCO 1 is controlled by the first control voltage VCNT1 and the second control voltage VCNT2 to the first VCO 1. The oscillation frequency of the second VCO 2 is controlled by the first control voltage VCNT1 and the second control voltage VCNT2 to the second VCO 2. The first variable capacitor 22 constitutes first oscillation frequency control means. The second variable capacitor 23 constitutes second oscillation frequency control means.

The Q-VCO 3 is constituted by an integrated circuit. In other words, each element shown in FIG. 2 is manufactured by a semiconductor process. In the first embodiment, an element value of each element shown in FIG. 2 has a mismatch variation of about 0.5%.

An I signal output terminal 4 outputs the I signal output from the Q-VCO 3 to the outside of the IQ signal source 100. A Q signal output terminal 5 outputs the Q signal output from the Q-VCO 3 to the outside of the IQ signal source 100.

A phase detector 6 detects a phase difference between the I signal output from the Q-VCO 3 and the Q signal output from the Q-VCO 3, that is, an IQ phase difference, and outputs a voltage of a value depending on an error of the IQ phase difference with respect to 90 degrees. More specifically, the phase detector 6 outputs a positive voltage when the IQ phase difference is smaller than 90 degrees, and outputs a negative voltage when the IQ phase difference is larger than 90 degrees.

The phase detector 6 is constituted by, for example, a multiplier 40 shown in FIG. 3A. In response to a phase difference between a signal input to an input terminal 41 and a signal input to an input terminal 42 (hereinafter referred to as "input phase difference"), the multiplier 40 outputs a voltage of a value based on a characteristic diagram of FIG. 3B from an output terminal 43. As shown in FIG. 3B, within a range in which the input phase difference is 0 degrees to 180 degrees, the multiplier 40 outputs a positive voltage when the IQ phase difference is smaller than 90 degrees, outputs a negative voltage when the IQ phase difference is greater than 90 degrees, and outputs a voltage of 0 volts (V) when the IQ phase difference is 90 degrees.

Note that the phase detector 6 using the multiplier 40 has a characteristic that it becomes difficult to be influenced by production tolerance with respect to detection accuracy only when the IQ phase difference is a value near 90 degrees. In this case, generally, a detection accuracy of equal to or less than 0.5 degrees can be realized.

A comparator 7 has an input terminal 51 to which the output voltage of the phase detector 6 is input and an input terminal 52 to which a preset reference voltage is input. The comparator 7 compares the voltage input to the input terminal 51 and the voltage input to the input terminal 52, and outputs a binary voltage depending on a result of the comparison from an output terminal 53.

Specifically, for example, the reference voltage is set to a value equal to a potential of the GND. When the output voltage of the phase detector 6 is higher than the reference voltage, the comparator 7 outputs a voltage of a value equivalent to a voltage applied from a power supply (not shown) (hereinafter referred to as "HIGH value"). On the other hand, when the output voltage of the phase detector 6 is equal to or lower than the reference voltage, the comparator 7 outputs a voltage of a value of approximately 0 V (hereinafter referred to as "LOW value").

In other words, when the IQ phase difference is smaller than 90 degrees, the phase detector 6 outputs the positive voltage, and the comparator 7 outputs the HIGH value voltage. When the IQ phase difference is larger than 90 degrees, the phase detector 6 outputs the negative voltage, and the comparator 7 outputs the LOW value voltage.

A filter circuit 8 is constituted by a low pass filter and has a preset time constant. The filter circuit 8 passes only a component of the output voltage of the comparator 7 that is equal to or less than the time constant, that is, passes only a component of the output voltage of the comparator 7 including a DC voltage. Hereinafter, for the sake of simplicity, the filter circuit 8 passes only the DC voltage. In the filter circuit 8, a change of an output voltage with respect to a change of an input voltage is delayed in dependence on the time constant.

A circuit composed of: the phase detector 6, the comparator 7, and the filter circuit 8 performs the same function as a phase locked loop (hereinafter referred to as "PLL") for the Q-VCO 3. The phase detector 6, the comparator 7, and the filter circuit 8 constitute a second phase locked loop (hereinafter referred to as "second PLL") 9. The output voltage of the filter circuit 8, that is, an output voltage of the second PLL 9 is input to the second voltage input terminal 26 of the first VCO 1. Therefore, the output voltage of the second PLL 9 becomes the second control voltage VCNT2 to the first VCO 1.

A first phase locked loop (hereinafter referred to as "first PLL") 10 compares a frequency of the I signal or Q signal output from the Q-VCO 3 with a frequency of a reference signal, and outputs a voltage depending on a result of the comparison. This reference signal is input to a reference signal input terminal 11 from the outside of the IQ signal source 100.

In other words, the first PLL 10 is constituted by a general PLL, and has an input terminal 61 for receiving an input of the I signal or Q signal (I signal in the example shown in FIG. 1) and an input terminal 62 for receiving an input of the reference signal. The first PLL 10 divides the signal input to the input terminal 61 by a preset division number, compares a frequency after division with the frequency of the reference signal, and outputs a direct current of a value depending on a result of the comparison from an output terminal 63.

The output voltage of the first PLL 10 is input to the first voltage input terminal 25 of the first VCO 1, the first voltage input terminal 25 of the second VCO 2, and the second voltage input terminal 26 of the second VCO 2. Therefore, the output voltage of the first PLL 10 becomes the first control voltage VCNT1 to the first VCO 1, the first control voltage VCNT1 to the second VCO 2, and the second control voltage VCNT2 to the second VCO 2.

When only the output voltage of the second PLL 9 (that is, the second control voltage VCNT2 to the first VCO 1) changes in a state in which the first VCO 1 and the second VCO are electrically coupled and the output voltage of the first PLL 10 is input to the first voltage input terminal 25 of the first VCO 1, the first voltage input terminal 25 of the second VCO 2, and the second voltage input terminal 26 of the second VCO 2, the IQ phase difference changes because the phase of the I signal changes. This is because the constant of the LC parallel resonant circuit in the first VCO 1 changes with respect to the constant of the LC parallel resonant circuit in the second VCO 2.

Hereinafter, in the first embodiment, an example in which the IQ phase difference becomes larger as the second control voltage VCNT2 to the first VCO 1 becomes higher and the IQ phase difference becomes smaller as the second control voltage VCNT2 to the first VCO 1 becomes lower will be mainly described. Note that a maximum value of the second control voltage VCNT2 is a value corresponding to the HIGH value, and a minimum value of the second control voltage VCNT2 is a value corresponding to the LOW value (that is, approximately 0 V).

The Q-VCO 3, the I signal output terminal 4, the Q signal output terminal 5, the second PLL 9, the first PLL 10, and the reference signal input terminal 11 constitute a main part of the IQ signal source 100.

Next, operation of the IQ signal source 100 will be described with reference to a timing chart of FIG. 4.

At time t0, the Q-VCO 3 starts operation. Thereby, output of the I signal and the Q signal is started. Further, at time t0, the first PLL 10 also starts operation. Thereby, the frequency of the signal (that is, each of the I signal and the Q signal) output from the Q-VCO 3 is locked to a value depending on the product of the frequency of the reference signal and the division number set in the first PLL 10. At this time, in the IQ phase difference, an error occurs due to a relative element value variation, that is, a mismatch variation in the integrated circuit. In the example shown in FIG. 4, an error of +2 degrees occurs, and the IQ phase difference at time t0 is 92 degrees.

Since the IQ phase difference is greater than 90 degrees, the phase detector 6 outputs the negative voltage, and the comparator 7 outputs the LOW value voltage. Therefore, the output voltage of the filter circuit 8 becomes approximately 0 V, and the second control voltage VCNT2 of the first VCO 1 becomes approximately 0 V, so that a value of the IQ phase difference gradually decreases. As the value of the IQ phase difference decreases, the output voltage of the phase detector 6 rises on the basis of the characteristic diagram of FIG. 3B.

At time t1, the IQ phase difference becomes smaller than 90 degrees. Therefore, the output voltage of the phase detector 6 becomes positive, and the output voltage of the comparator 7 switches from the LOW value to the HIGH value. Here, since the filter circuit 8 has a delay depending on the time constant, the output voltage of the filter circuit 8 gradually rises from approximately 0 V. As a result, the second control voltage VCNT2 to the first VCO 1 also gradually rises, and at time t2, the value of the IQ phase difference shifts from the decrease to an increase. As a result, the output voltage of the phase detector 6 turns from the rising to falling.

At time t3, the IQ phase difference becomes larger than 90 degrees. Therefore, the output voltage of the phase detector 6 becomes negative, and the output voltage of the comparator 7 switches from the HIGH value to the LOW value. The output voltage of the filter circuit 8 gradually decreases from the previous value due to the delay. As a result, the second control voltage VCNT2 to the first VCO 1 also gradually decreases, and at time t4, the value of the IQ phase difference shifts from the increase to a decrease. As a result, the output voltage of the phase detector 6 turns from the falling to rising.

Similarly, the IQ phase difference converges to 90 degrees while repeating an overshoot due to the delay of the filter circuit 8. In a state in which the IQ phase difference sufficiently approaches 90 degrees, that is, a state after time t5, the comparator 7 alternately outputs the HIGH value voltage and the LOW value voltage, and the filter circuit 8 outputs a DC voltage by filtering these voltages. Finally, the output voltage of the filter circuit 8 has a value corresponding to the second control voltage VCNT2 so that the IQ phase difference is 90 degrees.

As described above, since negative feedback for the IQ phase difference is formed by the phase detector 6, the comparator 7, and the filter circuit 8, the second control voltage VCNT2 to the first VCO 1 can be changed so that the voltage input to the input terminal 51 of the comparator 7 converges to 0 V, that is, the IQ phase difference converges to 90 degrees. As a result, an error of the IQ phase difference due to the mismatch variation can be compensated, and accuracy of the IQ phase difference can be improved.

Note that when the mismatch variation in the Q-VCO 3 is about 0.5%, it is preferable to set the capacitance of the first variable capacitor 22 to a value equal to or more than 10 times the capacitance of the second variable capacitor 23 in the first VCO 1. As a result, since a phase shift amount of several degrees to several tens of degrees can be secured, it is possible to sufficiently compensate the error of the IQ phase difference due to the mismatch variation of about 0.5%. Further, by setting the capacitance of the first variable capacitor 22 to a value sufficiently larger than the capacitance of the second variable capacitor 23, a frequency range controllable by the first PLL 10 can be broadened, and the high-accuracy IQ signal source 100 can be realized in a wide band.

Figure 5:
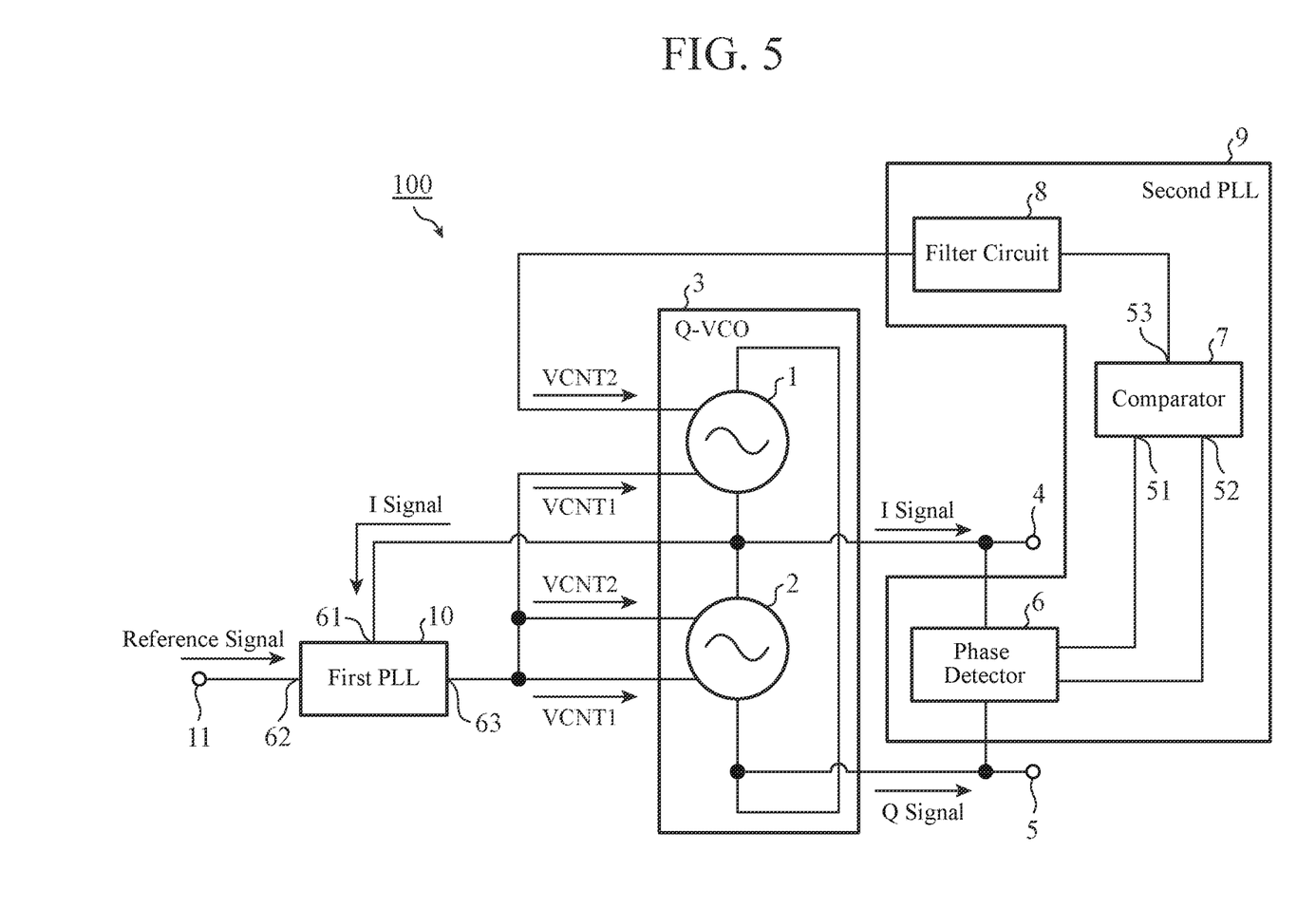
FIG. 5 is a circuit diagram showing a main part of another IQ signal source according to the first embodiment of the present invention.

Further, in the example shown in FIG. 1, the output of the phase detector 6 is a single phase, and the comparator 7 compares the output voltage of the phase detector 6 with the reference voltage. On the other hand, as shown in FIG. 5, using a differential phase detector 6, a voltage of one signal output by the phase detector 6 and a voltage of another signal output by the phase detector 6 may be compared by the comparator 7. By using the differential phase detector 6, the reference voltage can be made unnecessary.

Further, the first oscillation frequency control means may be any one as long as it controls the oscillation frequency on the basis of the voltage input to the first voltage input terminal 25, that is, the first control voltage VCNT1, and is not limited to the first variable capacitor 22. The second oscillation frequency control means may be any one as long as it controls the oscillation frequency on the basis of the voltage input to the second voltage input terminal 26, that is, the second control voltage VCNT2, and is not limited to the second variable capacitor 23.

In addition, each of the first VCO 1 and the second VCO 2 may have one or more voltage input terminals and one or more oscillation frequency control means for controlling the oscillation frequency on the basis of the voltage input to the voltage input terminals, and the number of voltage input terminals and oscillation frequency control means is not limited to two.

Figure 6:
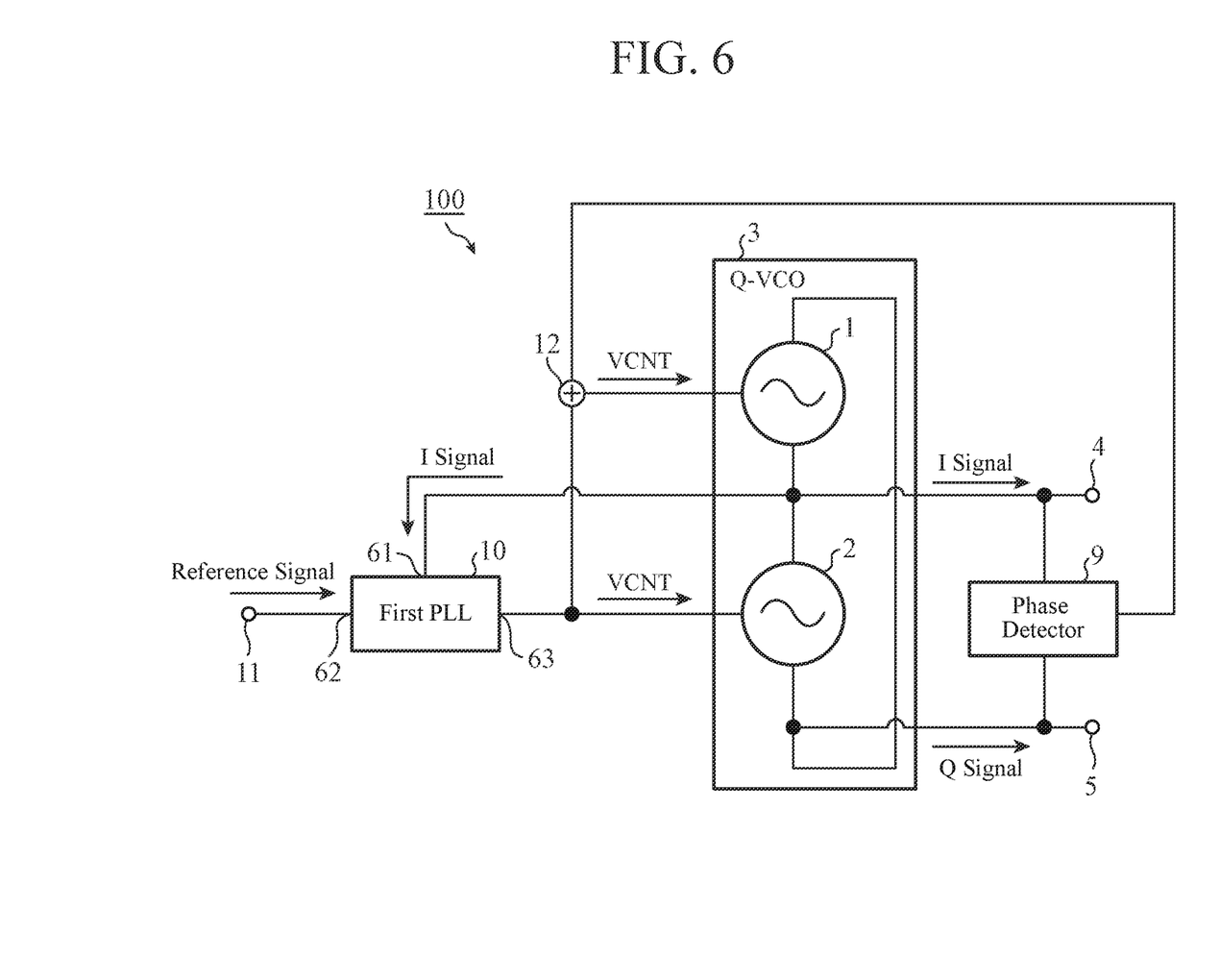
FIG. 6 is a circuit diagram showing a main part of another IQ signal source according to the first embodiment of the present invention.

For example, as shown in FIG. 6, each of the first VCO 1 and the second VCO 2 may have one voltage input terminal and one oscillation frequency control means for controlling an oscillation frequency on the basis of an input voltage (hereinafter referred to as "control voltage") VCNT to this voltage input terminal. In this case, an adder 12 may add an output voltage of the first PLL 10 and an output voltage of the second PLL 9, and a voltage after the addition may be the control voltage VCNT. At this time, in each of the first VCO 1 and the second VCO 2, the second variable capacitor 23 and the second voltage input terminal 26 are eliminated from the circuit shown in FIG. 2, the first variable capacitor 22 can be used for one oscillation frequency control means, and the first voltage input terminal 25 can be used for one voltage input terminal.

As described above, the IQ signal source 100 in the first embodiment includes: the Q-VCO 3 having the first VCO 1 and the second VCO 2, the IQ signal source 100 outputting an I signal and a Q signal by electrically coupling the first VCO 1 and the second VCO 2 with each other; the first PLL 10 for comparing a frequency of the I signal or the Q signal with a frequency of a reference signal input from the outside of the IQ signal source 100 and outputting a voltage depending on a result of the comparison; and the second PLL 9 for detecting an IQ phase difference and outputting a voltage depending on the IQ phase difference, wherein the IQ phase difference converges to 90 degrees in dependence on the output voltage of the first PLL 10 and the output voltage of the second PLL 9. Thereby, an error of the IQ phase difference due to a mismatch variation can be compensated, and accuracy of the IQ phase difference can be improved.

Further, in the IQ signal source 100, an oscillation frequency of the first VCO 1 is controlled by the output voltage of the first PLL 10 and the output voltage of the second PLL 9, and an oscillation frequency of the second VCO 2 is controlled by the output voltage of the first PLL 10, so that the IQ phase difference converges to 90 degrees. Thereby, the IQ signal source 100 by the circuit shown in FIG. 1, 5, or 6 can be realized.

Further, each of the first VCO 1 and the second VCO 2 has the first voltage input terminal 25, the second voltage input terminal 26, the first oscillation frequency control means for controlling an oscillation frequency on the basis of a voltage input to the first voltage input terminal 25, and the second oscillation frequency control means for controlling an oscillation frequency on the basis of a voltage input to the second voltage input terminal 26, the output voltage of the first PLL 10 is input to the first voltage input terminal 25 of the first VCO 1, the first voltage input terminal 25 of the second VCO 2, and the second voltage input terminal 26 of the second VCO 2, and the output voltage of the second PLL 9 is input to the second voltage input terminal 26 of the first VCO 1. Thereby, the IQ signal source 100 by the circuit shown in FIG. 1 or 5 can be realized.

Further, the second PLL 9 has the phase detector 6 for detecting the IQ phase difference and outputting a voltage of a value depending on an error of the IQ phase difference with respect to 90 degrees, the comparator 7 for comparing the output voltage of the phase detector 6 with a reference voltage and outputting a binary voltage depending on a result of the comparison, and the filter circuit 8 for the output voltage of the comparator 7, thereby forming negative feedback for the IQ phase difference. Thereby, the IQ signal source 100 by the circuit shown in FIG. 1 can be realized.

Further, the first oscillation frequency control means is constituted by the first variable capacitor 22, and the second oscillation frequency control means is constituted by the second variable capacitor 23. Thereby, the first VCO 1 and the second VCO 2 by the circuit shown in FIG. 2 can be realized.

Further, a capacitance of the first variable capacitor 22 is set to a value equal to or more than 10 times a capacitance of the second variable capacitor 23. As a result, it is possible to sufficiently compensate for an error of the IQ phase difference due to a mismatch variation of about 0.5%.

Also, the Q-VCO 3 is constituted by the integrated circuit. As a result, the Q-VCO 3 has a mismatch variation of several percent at the maximum and equal to or less than 0.5% at the minimum. The IQ signal source 100 can compensate for an error of the IQ phase difference due to this mismatch variation.

Second Embodiment

Figure 7:
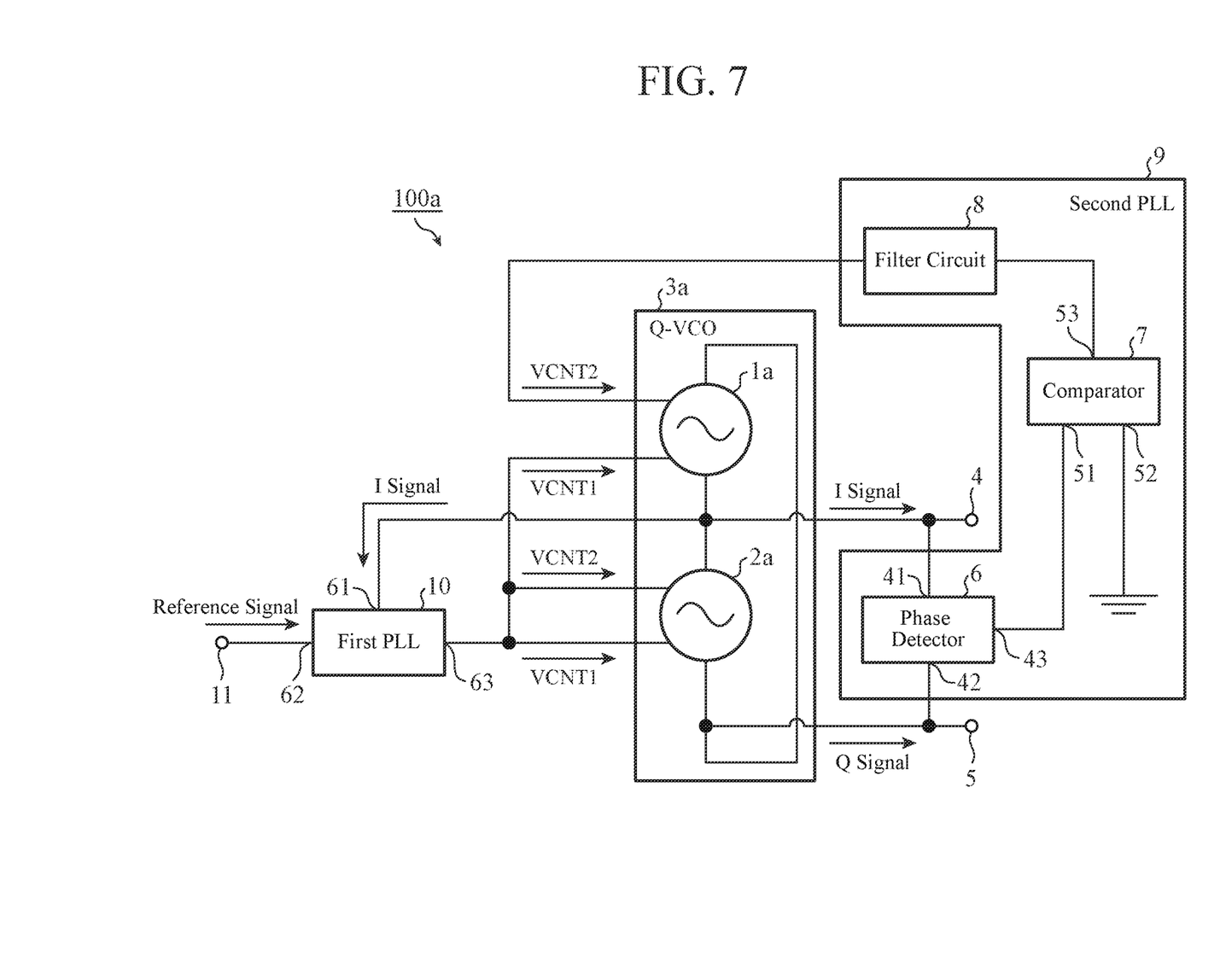
FIG. 7 is a circuit diagram showing a main part of an IQ signal source according to a second embodiment of the present invention.
Figure 8A:
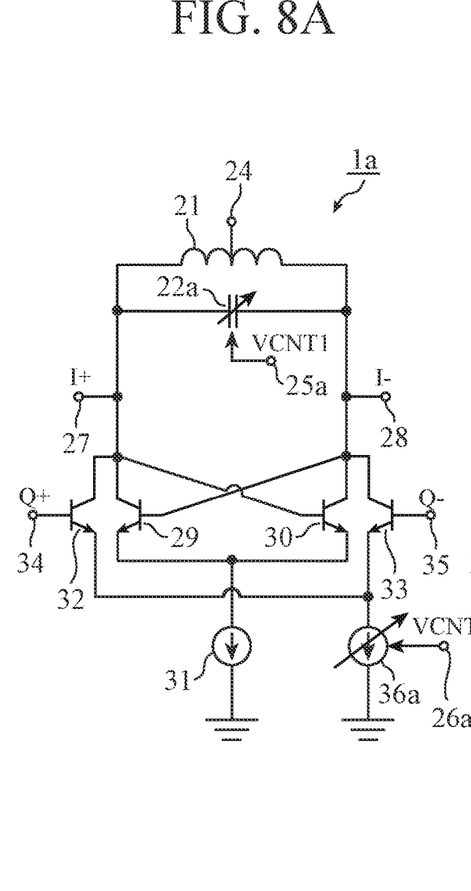
FIG. 8A is a circuit diagram showing a main part of a first VCO according to the second embodiment of the present invention.
Figure 8B:
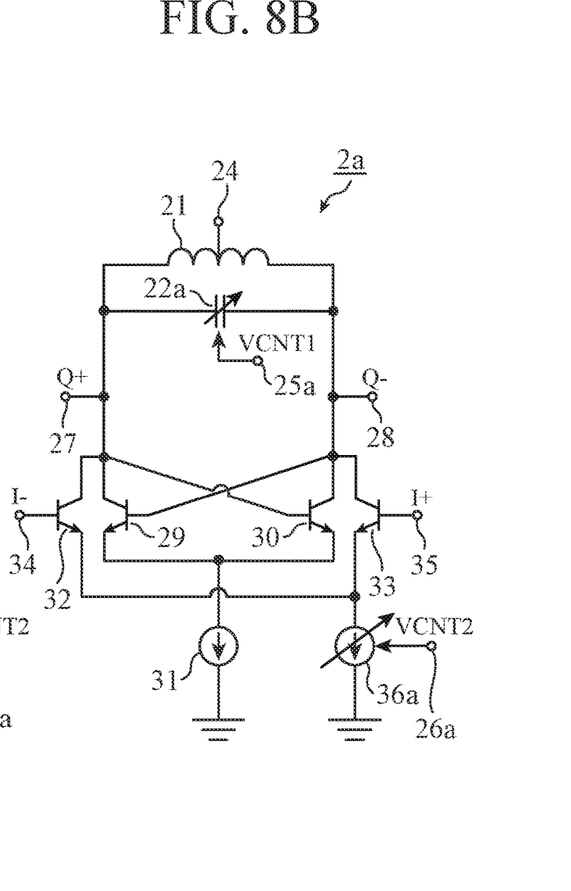
FIG. 8B is a circuit diagram showing a main part of a second VCO according to the second embodiment of the present invention.

FIG. 7 is a circuit diagram showing a main part of an IQ signal source according to a second embodiment of the present invention. FIG. 8A is a circuit diagram showing a main part of a first VCO according to the second embodiment of the present invention. FIG. 8B is a circuit diagram showing a main part of a second VCO according to the second embodiment of the present invention. An IQ signal source 100a according to the second embodiment will be described with reference to FIGS. 7 and 8. Note that in FIG. 7, the same reference numerals are given to blocks and the like similar to the IQ signal source 100 shown in FIG. 1, and description thereof will be omitted. In FIG. 8, the same reference numerals are given to elements and the like similar to the first VCO 1 and the second VCO 2 shown in FIG. 2, and description thereof will be omitted.

As shown in FIG. 7, a Q-VCO 3a is constituted by a first VCO 1a and a second VCO 2a. The Q-VCO 3a outputs an I signal and a Q signal by electrically coupling the first VCO 1a and the second VCO 2a with each other.

As shown in FIG. 8, an inductor 21 and a variable capacitor 22a constitute an LC parallel resonant circuit. A capacitance of the variable capacitor 22a changes in dependence on an input voltage to a first voltage input terminal 25a, that is, a first control voltage VCNT1. The variable capacitor 22a constitutes oscillation frequency control means.

A variable current source 36a is provided between an emitter of coupling transistors 32 and 33 for coupling and GND. A current value of the variable current source 36a changes in dependence on an input voltage to a second voltage input terminal 26a, that is, a second control voltage VCNT2.

Here, an IQ phase difference in the Q-VCO 3a becomes a value depending on a signal amount flowing from output terminals 27 and 28 of the second VCO 2a to input terminals 34 and 35 of the first VCO 1a, that is, a coupling amount of the first VCO 1a to the second VCO 2a, and a signal amount flowing from output terminals 27 and 28 of the first VCO 1a to input terminals 34 and 35 of the second VCO 2a, that is, a coupling amount of the second VCO 2a to the first VCO 1a. The coupling amount of the first VCO 1a to the second VCO 2a has a value depending on a current value of the variable current source 36a of the first VCO 1a. The coupling amount of the second VCO 2a to the first VCO 1a has a value depending on a current value of the variable current source 36a of the second VCO 2a.

Therefore, the coupling amount of the first VCO 1a to the second VCO 2a is controlled by the second control voltage VCNT2 to the first VCO 1a, that is, an output voltage of a second PLL 9. The coupling amount of the second VCO 2a to the first VCO 1a is controlled by the second control voltage VCNT2 to the second VCO 2a, that is, an output voltage of a first PLL 10. The variable current source 36a constitutes coupling amount control means.

When only the output voltage of the second PLL 9 (that is, the second control voltage VCNT2 to the first VCO 1a) changes in a state in which the first VCO 1a and the second VCO 2a are electrically coupled and the output voltage of the first PLL 10 is input to the first voltage input terminal 25a of the first VCO 1a, the first voltage input terminal 25a of the second VCO 2a, and the second voltage input terminal 26a of the second VCO 2a, an IQ phase difference changes due to a change in the coupling amount of the first VCO 1a to the second VCO 2a. For example, as the second control voltage VCNT2 is higher, the IQ phase difference is larger, and as the second control voltage VCNT2 is lower, the IQ phase difference is smaller.

The Q-VCO 3a, an I signal output terminal 4, a Q signal output terminal 5, the second PLL 9, the first PLL 10, and a reference signal input terminal 11 constitute a main part of the IQ signal source 100a.

Figure 4:
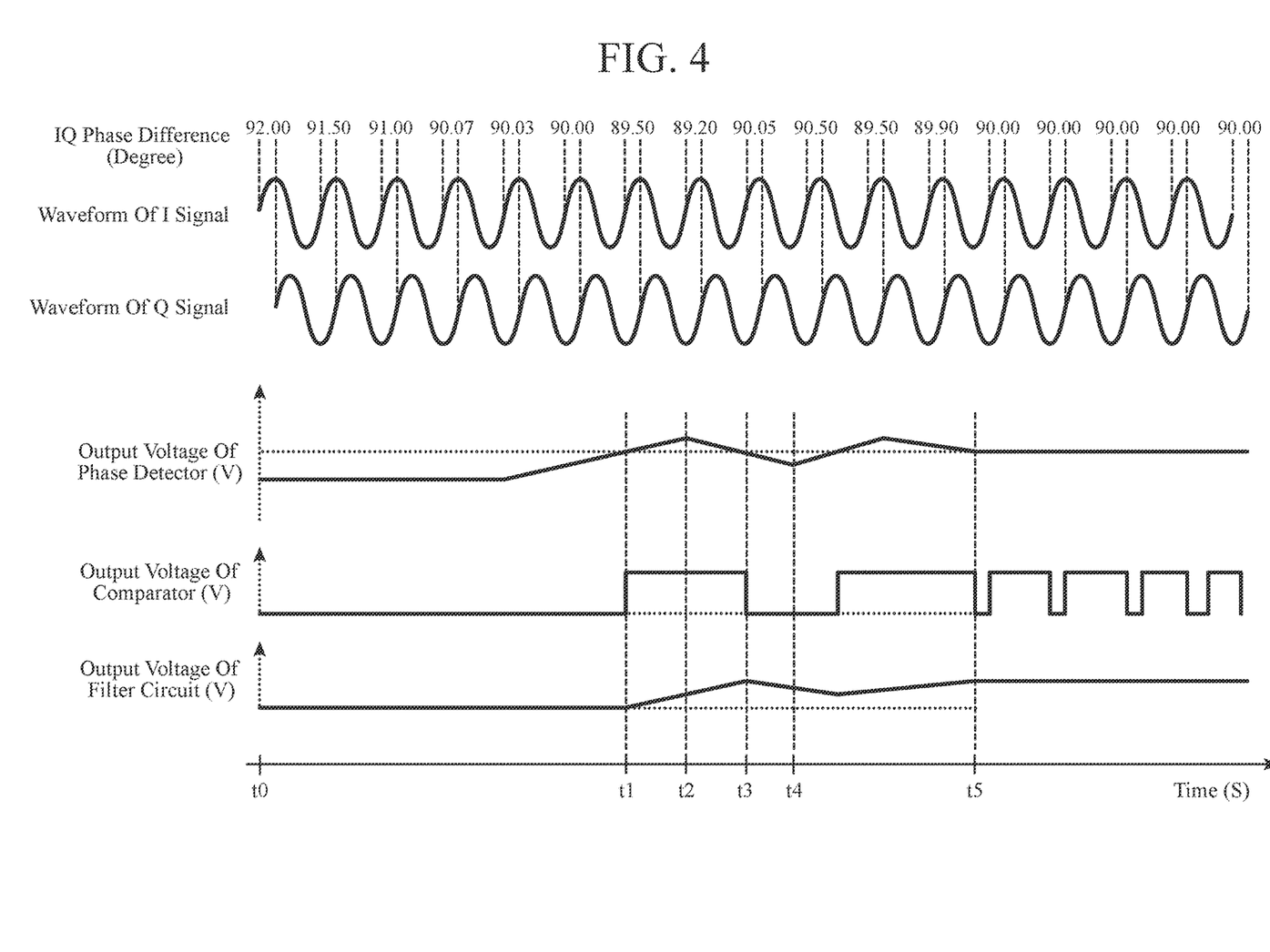
FIG. 4 is a timing chart showing an IQ phase difference, a waveform of an I signal, a waveform of a Q signal, an output voltage of the phase detector, an output voltage of a comparator, and an output voltage of a filter circuit in the IQ signal source according to the first embodiment of the present invention.

Since operation of the IQ signal source 100a is the same as that described in the first embodiment with reference to the timing chart of FIG. 4, illustration and description thereof are omitted. In other words, since negative feedback for the IQ phase difference is formed by a phase detector 6, a comparator 7, and a filter circuit 8, the second control voltage VCNT2 to the first VCO 1a can be changed so that a voltage input to an input terminal 51 of the comparator 7 converges to 0 V, that is, the IQ phase difference converges to 90 degrees. As a result, an error of the IQ phase difference due to a mismatch variation can be compensated, and accuracy of the IQ phase difference can be improved.

Note that a differential phase detector 6 similar to the one in the IQ signal source 100 shown in FIG. 5 may be used for the IQ signal source 100a.

Further, the oscillation frequency control means may be any one as long as it controls an oscillation frequency of the first VCO 1a or the second VCO 2a on the basis of the voltage input to the first voltage input terminal 25a, that is, the first control voltage VCNT1, and is not limited to the variable capacitor 22a.

Further, the coupling amount control means may be any one as long as it controls the coupling amount between the first VCO 1a and the second VCO 2a on the basis of the voltage input to the second voltage input terminal 26a, that is, the second control voltage VCNT2, and is not limited to the variable current source 36a.

As described above, in the IQ signal source 100a of the second embodiment, a coupling amount of the second VCO 2a to the first VCO 1a is controlled by an output voltage of the first PLL 10, and a coupling amount of the first VCO 1a to the second VCO 2a is controlled by an output voltage of the second PLL 9, so that the IQ phase difference converges to 90 degrees. Thereby, an error of the IQ phase difference due to a mismatch variation can be compensated, and accuracy of the IQ phase difference can be improved.

Further, each of the first VCO 1a and the second VCO 2a has: the first voltage input terminal 25a; the second voltage input terminal 26a; the oscillation frequency control means for controlling an oscillation frequency on the basis of a voltage input to the first voltage input terminal 25a; and the coupling amount control means for controlling a coupling amount on the basis of a voltage input to the second voltage input terminal 26a, the output voltage of the first PLL 10 is input to the first voltage input terminal 25a of the first VCO 1a, the first voltage input terminal 25a of the second VCO 2a, and the second voltage input terminal 26a of the second VCO 2a, and the output voltage of the second PLL 9 is input to the second voltage input terminal 26a of the first VCO 1a. Thus, the IQ signal source 100a by the circuit shown in FIG. 7 can be realized.

Further, the coupling amount control means is constituted by the variable current source 36a. Thereby, the first VCO 1a and the second VCO 2a by the circuit shown in FIG. 8 can be realized.

Also, the oscillation frequency control means is constituted by the variable capacitor 22a. Thereby, the first VCO 1a and the second VCO 2a by the circuit shown in FIG. 8 can be realized.

It is to be noted that the present invention can freely combine embodiments, modify arbitrary components in the embodiments, or omit arbitrary components in the embodiments within the scope of the invention.

INDUSTRIAL APPLICABILITY

The IQ signal source of the present invention can be used, for example, to generate I and Q signals in a radio communication device or a radar.

REFERENCE SIGNS LIST 1, 1a: First voltage controlled oscillator (first VCO), 2, 2a: Second voltage controlled oscillator (second VCO), 3, 3a: Quadrature voltage controlled oscillator (Q-VCO), 4: I signal output terminal, 5: Q signal output terminal, 6: Phase detector, 7: Comparator, 8: Filter circuit, 9: Second phase locked loop (second PLL), 10: First phase locked loop (first PLL), 11: Reference signal input terminal, 12: Adder, 21: Inductor, 22: First variable capacitor, 22a: Variable capacitor, 23: Second variable capacitor, 24: Power supply application terminal, 25, 25a: First voltage input terminal, 26, 26a: Second voltage input terminal, 27, 28: Output terminal, 29, 30: Transistor, 31: DC current source, 32, 33: Transistor, 34, 35: Input terminal, 36: DC current source, 36a: Variable current source, 40: Multiplier, 41, 42: Input terminal, 43: Output terminal, 51, 52: Input terminal, 53: Output terminal, 61, 62: Input terminal, 63: Output terminal, 100, 100a: IQ signal source

The invention claimed is:

1. An IQ signal source comprising:
a quadrature voltage controlled oscillator having a first voltage controlled oscillator and a second voltage controlled oscillator, the quadrature voltage controlled oscillator outputting an in-phase signal and a quadrature signal by electrically coupling the first voltage controlled oscillator and the second voltage controlled oscillator with each other;
a first phase locked loop to compare a frequency of the in-phase signal or the quadrature signal with a frequency of a reference signal input from an outside of the IQ signal source and to output a voltage depending on a result of the comparison; and
a second phase locked loop to detect a phase difference between the in-phase signal and the quadrature signal and to output a voltage depending on the phase difference,
wherein the phase difference converges to 90 degrees in dependence on the output voltage of the first phase locked loop and the output voltage of the second phase locked loop.

2. The IQ signal source according to claim 1, wherein an oscillation frequency of the first voltage controlled oscillator is controlled by the output voltage of the first phase locked loop and the output voltage of the second phase locked loop, and an oscillation frequency of the second voltage controlled oscillator is controlled by the output voltage of the first phase locked loop, so that the phase difference converges to 90 degrees.

3. The IQ signal source according to claim 2, wherein each of the first voltage controlled oscillator and the second voltage controlled oscillator has: a first voltage input terminal; a second voltage input terminal; a first oscillation frequency controller to control an oscillation frequency on a basis of a voltage input to the first voltage input terminal; and a second oscillation frequency controller to control an oscillation frequency on a basis of a voltage input to the second voltage input terminal, and
the output voltage of the first phase locked loop is input to the first voltage input terminal of the first voltage controlled oscillator, the first voltage input terminal of the second voltage controlled oscillator, and the second voltage input terminal of the second voltage controlled oscillator, and the output voltage of the second phase locked loop is input to the second voltage input terminal of the first voltage controlled oscillator.

4. The IQ signal source according to claim 3, wherein the second phase locked loop has: a phase detector to detect the phase difference and to output a voltage of a value depending on an error of the phase difference with respect to 90 degrees; a comparator to compare an output voltage of the phase detector with a reference voltage and to output a binary voltage depending on a result of the comparison; and a filter circuit for the output voltage of the comparator, to form negative feedback for the phase difference.

5. The IQ signal source according to claim 3, wherein the first oscillation frequency controller is constituted by a first variable capacitor, and the second oscillation frequency controller is constituted by a second variable capacitor.

6. The IQ signal source according to claim 5, wherein a capacitance of the first variable capacitor is set to a value equal to or more than 10 times a capacitance of the second variable capacitor.

7. The IQ signal source according to claim 1, wherein a coupling amount of the second voltage controlled oscillator to the first voltage controlled oscillator is controlled by the output voltage of the first phase locked loop, and a coupling amount of the first voltage controlled oscillator to the second voltage controlled oscillator is controlled by the output voltage of the second phase locked loop, so that the phase difference converges to 90 degrees.

8. The IQ signal source according to claim 7, wherein each of the first voltage controlled oscillator and the second voltage controlled oscillator has: a first voltage input terminal; a second voltage input terminal; an oscillation frequency controller to control an oscillation frequency on a basis of a voltage input to the first voltage input terminal; and a coupling amount controller to control a coupling amount on a basis of a voltage input to the second voltage input terminal, and the output voltage of the first phase locked loop is input to the first voltage input terminal of the first voltage controlled oscillator, the first voltage input terminal of the second voltage controlled oscillator, and the second voltage input terminal of the second voltage controlled oscillator, and the output voltage of the second phase locked loop is input to the second voltage input terminal of the first voltage controlled oscillator.

9. The IQ signal source according to claim 8, wherein the second phase locked loop has: a phase detector to detect the phase difference and to output a voltage of a value depending on an error of the phase difference with respect to 90 degrees; a comparator to compare an output voltage of the phase detector with a reference voltage and to output a binary voltage depending on a result of the comparison; and a filter circuit for the output voltage of the comparator, to form negative feedback for the phase difference.

10. The IQ signal source according to claim 8, wherein the coupling amount controller is constituted by a variable current source.

11. The IQ signal source according to claim 8, wherein the oscillation frequency controller is constituted by a variable capacitor.

12. The IQ signal source according to claim 1, wherein the quadrature voltage controlled oscillator is constituted by an integrated circuit.

* * * * *